(12) United States Patent
Chen

(10) Patent No.: US 10,438,673 B1
(45) Date of Patent: Oct. 8, 2019

(54) ERASING METHOD AND STORAGE MEDIUM

(71) Applicant: SHINE BRIGHT TECHNOLOGY LIMITED, Wan Chai (HK)

(72) Inventor: Minyi Chen, Wan Chai (CN)

(73) Assignee: SHINE BRIGHT TECHNOLOGY LIMITED, Wan Chai (HK)

( * ) Notice: Subject to any disclaimer, the term of this patent is extended or adjusted under 35 U.S.C. 154(b) by 0 days.

(21) Appl. No.: 15/964,913

(22) Filed: Apr. 27, 2018

(51) Int. Cl.
*G11C 16/16* (2006.01)
*G11C 16/34* (2006.01)
*G11C 16/26* (2006.01)
*H01L 29/788* (2006.01)
*G11C 16/04* (2006.01)

(52) U.S. Cl.
CPC .......... *G11C 16/3445* (2013.01); *G11C 16/16* (2013.01); *G11C 16/26* (2013.01); *G11C 16/0408* (2013.01); *H01L 29/7883* (2013.01)

(58) Field of Classification Search
CPC ..... G11C 16/3445; G11C 16/16; G11C 16/26; G11C 16/0408; H01L 29/7883
USPC ........................................ 365/185.01–185.33
See application file for complete search history.

(56) References Cited

U.S. PATENT DOCUMENTS

| 8,958,249 B2 * | 2/2015 | Dutta | G11C 16/14 365/185.17 |
| 2014/0247667 A1 * | 9/2014 | Dutta | G11C 16/14 365/185.22 |
| 2016/0111165 A1 * | 4/2016 | Shim | G11C 16/16 365/185.11 |

* cited by examiner

*Primary Examiner* — Harry W Byrne
(74) *Attorney, Agent, or Firm* — Thomas Horstemeyer, LLP; Jason M. Perilla

(57) ABSTRACT

Provided are an erasing method, erasing apparatus for memory cells and a storage medium to perform erase loops with a more appropriate erasing voltages. The method includes performing erase loops on a target erasing block by sequentially using first erasing voltages Vn; and when a predetermined condition is reached, proceeding to perform erase loops on the target erasing block by sequentially using second erasing voltages Um until the target erasing block is successfully erased. $Vn=V1+(n-1)\times d1$, where n denotes erase loop counts of the first erasing voltages, n is an integer greater than or equal to 1, and V1 and d1 are positive numbers. $Um=Vn+(m-1)\times d2$, where m denotes erase loop counts of the second erasing voltages, m is an integer greater than or equal to 2, and d2 is a positive number not equal to d1.

11 Claims, 7 Drawing Sheets

US 10,438,673 B1

ERASING METHOD AND STORAGE MEDIUM

TECHNICAL FIELD

Embodiments of the present disclosure relate to memory technologies and, for example, relate to an erasing method and a storage medium.

BACKGROUND

Non-volatile flash memory (such as NAND flash memory) is a common memory chip. Data stored in the NAND flash memory will not be lost if the power is turned off and is electrically erasable and writable in a system. The NAND flash memory has the advantages of a large capacity and a fast rewriting speed and is suitable for storage of a large amount of data. The NAND flash memory has become the mainstream of the market due to a high integration level and a low cost.

FIG. 1 is a simplified schematic diagram of a common NAND flash memory including a memory cell array 11, a word line selection unit 12, a bit line selection unit 13, a charge pump 14 and a control unit 15. The memory cell array 11 is an array of memory cells which are arranged along the word lines and bit lines. Specifically, the memory cell array 11 is composed of multiple blocks, each block is composed of multiple pages, and each page is composed of memory cells connected by word lines and bit lines. Operations on memory cells generally include: an erase operation, a program (write) operation and a read operation. The erase operation is performed in blocks. The program operation and the read operation are performed in pages. For example, when an erase operation is performed on memory cells, the control unit 15 selects a specific erasing block through the word line selection unit 12 and the bit line selection unit 13, and controls the charge pump 14 to apply an erasing voltage to corresponding memory cells.

The erase operation can be easily performed on a fresh NAND flash memory chip that has just been put into use. Generally, after just 3 to 5 erase operations, data can be erased successfully. For a cycled NAND flash memory chip that has been put into use for a long time, with the increasing number of erase operations on the NAND flash memory, the erase operation becomes more difficult. Thus, how to make a cycled flash memory chip that has been put into use for a long time be erased successfully has been what those skilled in the art are trying to find out.

SUMMARY

The following is a summary of a subject matter described herein in detail. This summary is not intended to limit the scope of the claims.

Embodiments of the present disclosure provide an erasing method, erasing apparatus and storage medium for memory cells. By using the erasing method, a more appropriate erasing voltage is found and thus a memory cell that is difficult to be erased is erased successfully, thereby extending a lifespan of a flash memory chip.

In one aspect, embodiments of the present disclosure provide an erasing method for memory cells.

The method includes: performing erase loops on a target erasing block by sequentially using first erasing voltages $V_n$; and when a predetermined condition is reached, proceeding to perform erase loops on the target erasing block by sequentially using second erasing voltages $U_m$ until the target erasing block is successfully erased.

$V_n = V_1 + (n-1) \times d_1$, where n denotes erase loop counts of the first erasing voltages, n is an integer greater than or equal to 1, and $V_1$ and $d_1$ are all positive numbers; and $U_m = V_n + (m-1) \times d_2$, where m denotes erase loop counts of the second erasing voltages, m is an integer greater than or equal to 2, and $d_2$ is a positive number not equal to $d_1$.

In a second aspect, embodiments of the present disclosure further provide an erasing apparatus for memory cells.

The apparatus includes a first erasing circuit configured to perform erase loops on a target erasing block by sequentially using first erasing voltages $V_n$; and a second erasing circuit configured to, when a predetermined condition is reached, proceed to perform erase loops on the target erasing block by sequentially using second erasing voltages $U_m$ until the target erasing block is successfully erased.

$V_n = V_1 + (n-1) \times d_1$, where n denotes erase loop counts of the first erasing voltages, n is an integer greater than or equal to 1, and $V_1$ and $d_1$ are all positive numbers. $U_m = V_n + (m-1) \times d_2$, where m denotes erase loop counts of the second erasing voltages, m is an integer greater than or equal to 2, and $d_2$ is a positive number not equal to $d_1$.

In a third aspect, embodiments of the present disclosure further provide a storage medium containing the erasing apparatus described in the above second aspect.

In a fourth aspect, embodiments of the present disclosure further provide a storage medium containing computer-executable instructions that, when executed by a computer processor, implement the erasing method for memory cells described in the above first aspect.

The erasing method for memory cells provided by embodiments of the present disclosure changes a delta between erasing voltages used in two adjacent erase operations to find a more appropriate erasing voltage and thus successfully erases memory cells that are difficult to be erased, thereby extending a lifespan of a flash memory chip.

BRIEF DESCRIPTION OF DRAWINGS

Other aspects can be understood after the accompanying drawings and detailed description are read and understood.

DETAILED DESCRIPTION

The present disclosure will be further described in detail with reference to the accompanying drawings and embodiments. It is to be understood that the embodiments set forth below are intended to illustrate but not to limit the present disclosure. It is to be noted that to facilitate description, only part, not all, of structures related to the present disclosure are illustrated in the accompanying drawings.

Figure 1:
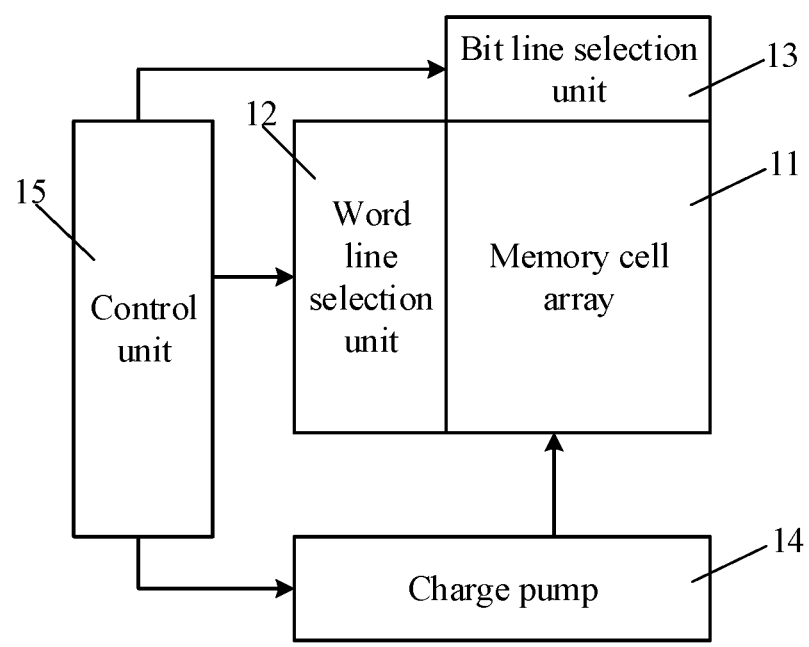
FIG. 1 is a simplified schematic diagram of an NAND flash memory in the related art.
Figure 2:
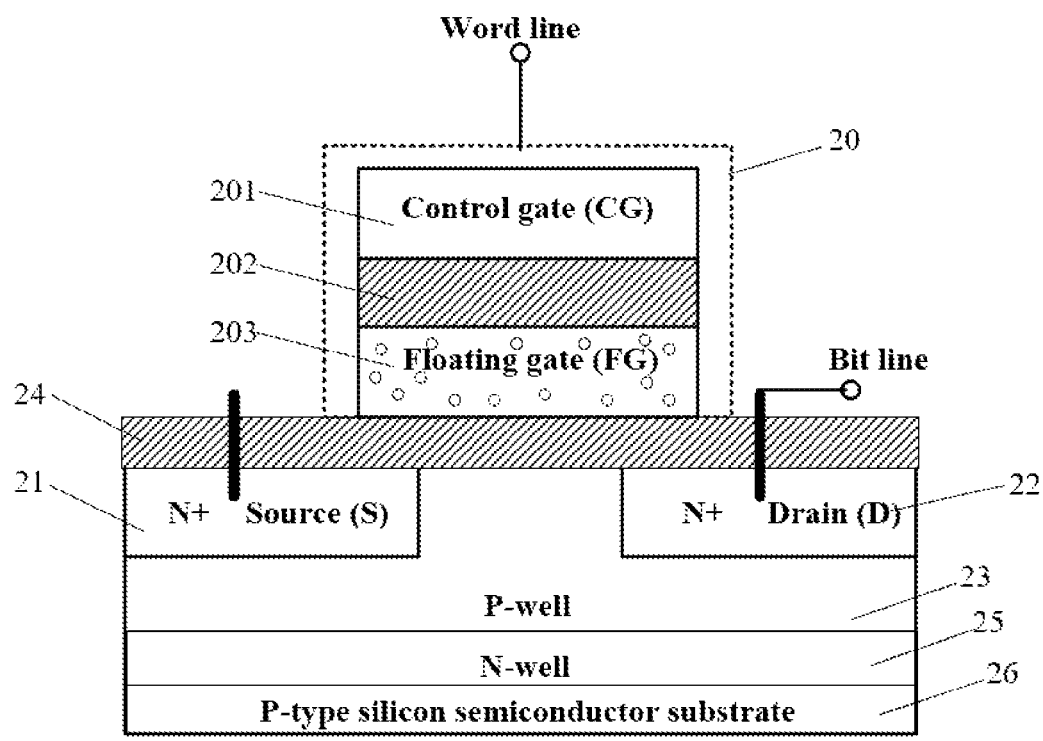
FIG. 2 is a schematic cross-sectional view of a memory cell in an NAND flash memory.

In non-volatile flash memories, a memory cell includes a Metal-Oxide-Semiconductor Field-Effect Transistor (MOSFET). FIG. 2 is a diagram showing a structure of a common MOSFET. The MOSFET includes a gate 20, a source 21, a drain 22, a P-well 23, an N-well 25, a substrate 26 (in this embodiment, the substrate 26 is a P-type silicon semiconductor substrate) and a tunnel oxide layer 24. Two N-type regions are formed in the P-type silicon semiconductor substrate 26 by diffusion. The tunnel oxide layer 24 covers the P-well 23. Two holes are formed in the tunnel oxide layer 24 above the N-type regions by etching. Three electrodes, i.e., the gate 20, the source 21 and the drain 22, are formed on the oxide layer and in the two holes by metallization. The source 21 and the drain 22 correspond to the two N-type regions. The drain 22 is electrically connected to a bit line of the memory cell. Further, the gate 20 further includes a control gate 201, an inter-poly dielectric (IPD) 202 and a floating gate 203. The floating gate 203 is electrically connected to a word line of the memory cell. Charges may be trapped in the floating gate 203.

The memory cell stores information 0 or 1 by storing the charges in the floating gate 203. When a large amount of charges are trapped in the floating gate 203, the memory cell has a large threshold voltage and stores information 0. When a small amount of charge is stored in the floating gate 203, the memory cell has a small threshold voltage and stores information 1. The purpose of performing the erase operation on the memory cell is to lower the threshold voltage of the memory cell (i.e., reduce the charges of the floating gate 203) so as to change the storage state of the memory cell, such that the memory cell stores information 1. After the memory cell undergoes multiple erase operations, the threshold voltage of the memory cell will drift. The threshold voltage drift causes the memory cell to be unable to be successfully erased, i.e., the memory cell cannot correctly store information 1. Therefore, it is important to successfully erasing the memory cell whose threshold voltage has drifted so that the memory cell correctly stores information and a lifespan of a memory chip is further extended.

Figure 3:
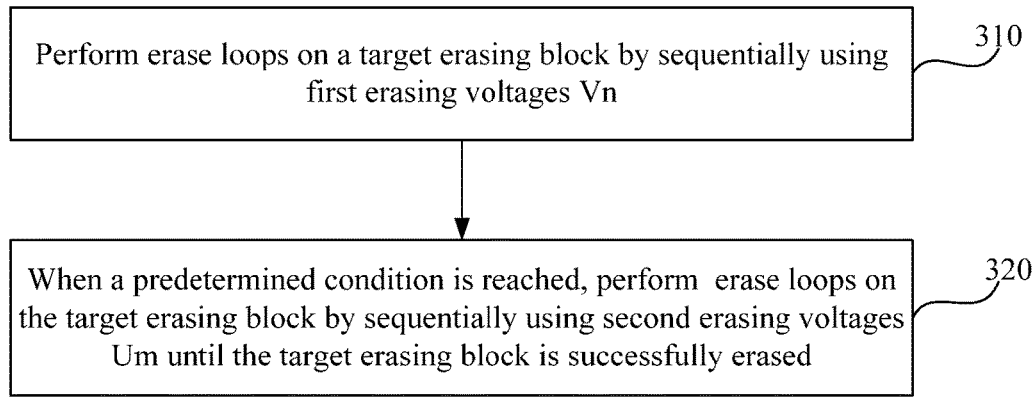
FIG. 3 is a flowchart of an erasing method for a non-volatile memory according to an embodiment of the present disclosure.

To solve the above related problem, FIG. 3 illustrates a flowchart of an erasing method for a non-volatile memory according to an embodiment of the present disclosure. The non-volatile memory is, for example, a NAND flash memory. This embodiment may be implemented by an erasing apparatus. The apparatus may be implemented inside a non-volatile memory (such as an NAND flash memory). As shown in FIG. 3, the erasing method provided in this embodiment includes the steps described below.

In step 310, erase loops are performed on a target erasing block sequentially using first erasing voltages Vn. In one or more embodiments, the target erasing block includes a plurality of memory cells. In one or more embodiments, the first erasing voltages are first incremental-step-pulses.

The erase loop is performed to write information 1 into the memory cells in the target erasing block.

In one embodiment, the step of performing the erase loops on the target block include: cyclically applying erasing voltages to a substrate of the memory cells in the target erasing block using a charge pump. Since the erasing voltages applied to the substrate of the memory cell in the target erasing block just needs to last for a period of milliseconds, usually the charge pump is used to apply the erasing voltage.

In one or more embodiments, each erase loop includes an erase phase and an erase verify phase. In the erase phase of each erase loop, the first erasing voltage (that is, the pulse) for this erase loop is applied to the substrate of the target erasing block. In the erase verify phase of each erase loop, an erase verify (a read operation) is performed on the plurality of memory cells of the target erasing block. If the result of the read operation indicates that the plurality of memory cells store information 1, it means that the target erasing block is successfully erased. In another embodiment, in addition to the erase phase and the erase verify phase, each erase loop includes a scan phase. In the scan phase of each erase loop, the result of the erase verify is stored.

Figure 4:
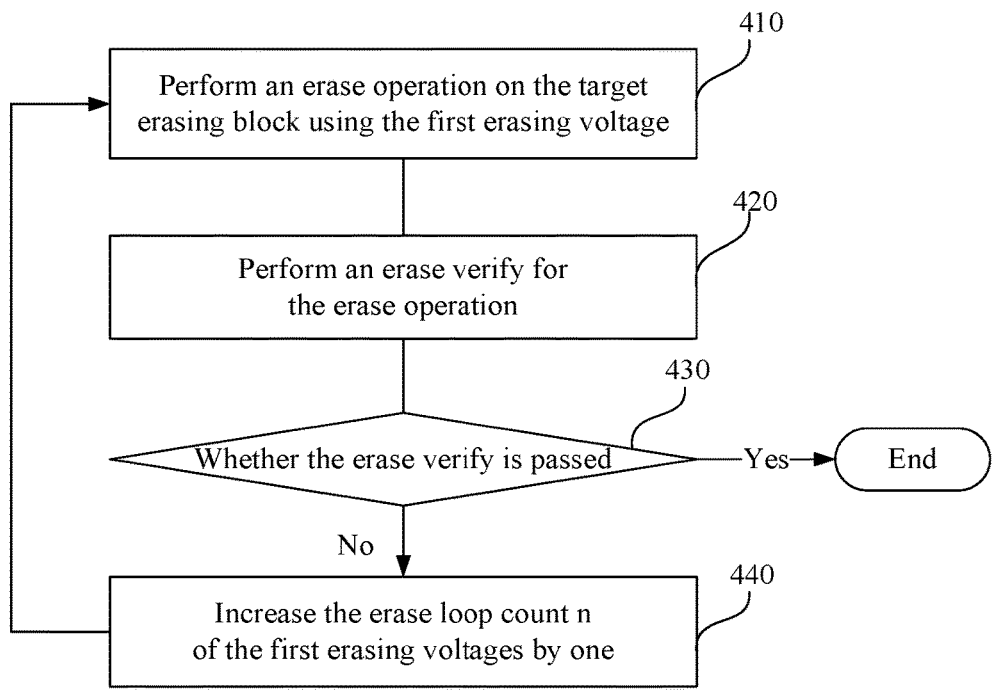
FIG. 4 is a flowchart of performing erase loops on a target erasing block using first erasing voltages according to an embodiment of the present disclosure.

FIG. 4 is a flowchart of performing erase loops on the target erasing block using the first erasing voltages. Referring to FIG. 4, the step of performing the erase loops on the target erasing block sequentially using the first erasing voltages Vn includes the steps described below.

In step 410, an erase operation is performed on the target erasing block using a first erasing voltage. That is, first erasing voltage (typically, the voltage pulse) is applied to the substrate of the target erasing block.

In step 420, an erase verify is performed for this erase operation.

In step 430, it is determined whether the erase verify is passed. If the erase verify is not passed, the process proceeds to step 440. If the erase verify is passed, it means that the target erasing block is successfully erased, and the process is ended.

In step 440, an erase loop count n is increased by one and the process returns to step 410.

The first erasing voltage Vn=V1+(n−1)×d1, where n denotes the erase loop count of the first erasing voltage, n is an integer greater than or equal to 1, and V1 and d1 are positive values. That is, the first erasing voltage Vn includes an arithmetic progression whose initial term and delta may be set by parameters. In one or more embodiments, e.g., the first erasing voltage V1 is 5 V and the delta d1 is 1 V. It is to be understood by those skilled in the art that values of the first erasing voltage V1 and the delta d1 may be set according to the actual situation. As example values, 5 V and 1 V are not intended to limit the first erasing voltage V1 and the delta d1. In one or more embodiments, 5 V≤the first erasing voltage Vn≤30 V and 0.1 V≤d1≤1.6 V. Usually the initial value V1 of the first erasing voltage Vn is 13 V. Assuming that the delta d1 is 1 V, then the step of performing the erase loops on the target erasing block sequentially using the first erasing voltages Vn includes the steps described below. For the first time, the erase loop is performed on the target erasing block with a first erasing voltage V1 of 13 V. If the erase verify of this erase loop is not passed, then the erase loop count n is increased by one. For the second time, the erase loop is performed on the target erasing block with a first erasing voltage V2 of 14 V. If the erase verify of this erase loop is not passed, then the erase loop count n is increased by one. For the third time, the erase loop is performed on the target erasing block with a first erasing voltage V3 of 15 V. The rest are done in the same manner.

In one or more embodiments, the step of performing the erase verify for the erase loop includes the steps described below.

A read operation is performed on the memory cells in the target erasing block.

If a reading result is 1, it is determined that the current erase loop succeeds. If the reading result is 0, it is determined that the current erase loop fails. Specifically, the charge pump may be used to apply corresponding reading voltages to the word line and the bit line of the memory cells in the erasing block, and an input terminal of a sense amplifier receives a current on the bit line; and the current on the bit line is compared with a reference current of the sense amplifier. The reading result is determined based on the comparison result.

In step 320, when a predetermined condition is reached, erase loops are performed on the target erasing block sequentially using second erasing voltages Um. In one or more embodiments, the second erasing voltages are second incremental-step-pulses.

If the target erasing block is not successfully erased by erase loops using the first erasing voltages Vn, then the delta (that is, the erasing voltage difference between two adjacent erase loops) is increased, i.e., the second erasing voltages Um are sequentially used to proceed the erase loops on the target erasing block, until the target erasing block is successfully erased. Um=Vn+(m−1)×d2, where m denotes an erase loop count of the second erasing voltage, m is an integer greater than or equal to 2, and d2 is a positive value not equal to d1. That is, the last value Vn of the first erasing voltage plus the delta d2 is used as the initial term of the second erasing voltage.

In one or more embodiments, each erase loop includes an erase phase and an erase verify phase. In the erase phase of each erase loop, the first erasing voltage (that is, the pulse) for this erase loop is applied to the substrate of the target erasing block. In the erase verify phase of each erase loop, an erase verify (a read operation) is performed on the plurality of memory cells of the target erasing block. If the result of the read operation indicates that the plurality of memory cells store information 1, it means that the target erasing block is successfully erased. In another embodiment, in addition to the erase phase and the erase verify phase, each erase loop includes a scan phase. In the scan phase of each erase loop, the result of the erase verify is stored.

In one embodiment, the step of performing the erase loops on the target erasing block using the second erasing voltages Um includes the steps described below.

An erase loop is performed on the target erasing block using the second erasing voltage Um.

An erase verify is performed for this erase loop.

If the erase verify is not passed, the erase loop count m of the second erasing voltage is increased by one and the process returns to the step of performing the erase loop on the target erasing block using the second erasing voltage Um.

If the erase verify is passed, the process is ended.

The initial value of the erase loop count m of the second erasing voltage is 2. That is, starting from 2, the last value Vn of the first erasing voltage plus the delta d2 is used as the initial term U2 of the second erasing voltage.

Figure 5:
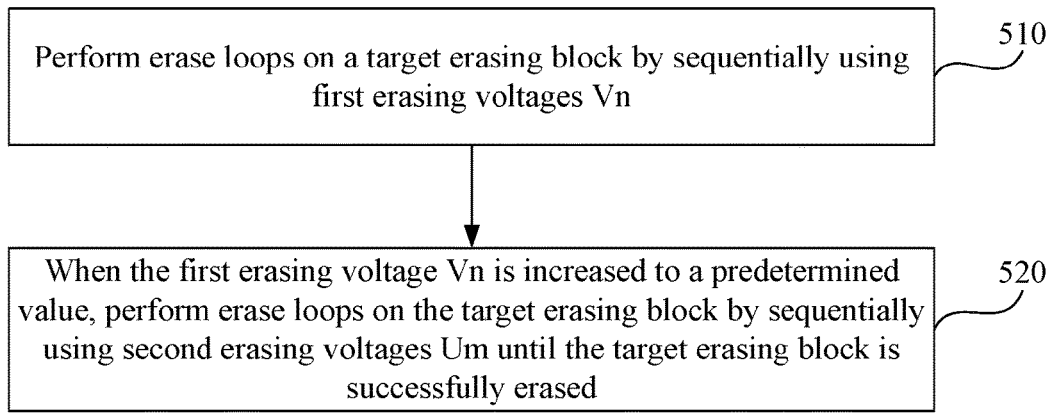
FIG. 5 is a flowchart of another erasing method for a non-volatile memory according to an embodiment of the present disclosure.

Referring to FIG. 5, which is a flowchart of another erasing method for non-volatile flash memory. In one or more embodiments, the predetermined condition is that the first erasing voltage Vn reaches a predetermined value. That is, the magnitude of the pulse reaches a predetermined value. The predetermined value may be determined by a parameter. For example, the predetermined value for the first erasing voltage may be 18 V. If the erasing still fails when the first erasing voltage Vn increases to 18 V, the second erasing voltages Um (that is, the second incremental-step-pulses) are used to perform the erase loops on the target erasing block.

In one or more embodiments, the predetermined value for the first erasing voltage may be set according to a table for the first erasing voltages Vn as shown in Table 1. In Table 1, the first five columns [4][3][2][1][0] represent bits of a register (corresponding to the parameter for setting the predetermined value) and the sixth column represents values of erasing voltages applied to the substrate of the memory cells. In performing the erase loops on the target erasing block with sequentially using the first erasing voltages Vn, a comparison circuit in the flash memory chip compares the current first erasing voltage Vn with the predetermined value for the first erasing voltage. When the first erasing voltage Vn reaches the predetermined value for the first erasing voltage (e.g., 18 V), the second erasing voltage Um is used to perform the erase loops on the target erasing block.

TABLE 1

Comparison parameter table for first erasing voltages Vn

| [4] | [3] | [2] | [1] | [0] | Pwell Erase Pulse Voltage (V) |
|---|---|---|---|---|---|
| 0 | 0 | 0 | 0 | 0 | 5 |
| 0 | 0 | 0 | 0 | 1 | 6 |
| 0 | 0 | 0 | 1 | 0 | 7 |
| 0 | 0 | 0 | 1 | 1 | 8 |
| 0 | 0 | 1 | 0 | 0 | 9 |
| 0 | 0 | 1 | 0 | 1 | 10 |
| 0 | 0 | 1 | 1 | 0 | 11 |
| 0 | 0 | 1 | 1 | 1 | 12 |
| 0 | 1 | 0 | 0 | 0 | 13 |
| 0 | 1 | 0 | 0 | 1 | 14 |
| 0 | 1 | 0 | 1 | 0 | 15 |
| 0 | 1 | 0 | 1 | 1 | 16 |
| 0 | 1 | 1 | 0 | 0 | 17 |
| 0 | 1 | 1 | 0 | 1 | 18 |
| 0 | 1 | 1 | 1 | 0 | 19 |
| 0 | 1 | 1 | 1 | 1 | 20 |
| 1 | 0 | 0 | 0 | 0 | 21 |
| 1 | 0 | 0 | 0 | 1 | 22 |
| 1 | 0 | 0 | 1 | 0 | 23 |
| 1 | 0 | 0 | 1 | 1 | 24 |
| 1 | 0 | 1 | 0 | 0 | 25 |
| 1 | 0 | 1 | 0 | 1 | 26 |
| 1 | 0 | 1 | 1 | 0 | 27 |
| 1 | 0 | 1 | 1 | 1 | 28 |
| 1 | 1 | 0 | 0 | 0 | 29 |
| 1 | 1 | 0 | 0 | 1 | 30 |

In one or more embodiments, the above step 320 is described below by using an example in which the predetermined condition is that the first erasing voltage Vn reaches the predetermined value for the first erasing voltage, the predetermined value for the first erasing voltage is 18 V, the initial erasing voltage is 13 V, d1=1 V and d2=1.5 V.

For the first time, the erase loop is performed on the target erasing block with a first erasing voltage V1 of 13 V. If the erase verify of this erase loop is not passed, then the erase loop count n of the first erasing voltage is increased by one. For the second time, the erase loop is performed on the target erasing block with a first erasing voltage V2 of 14 V. If the erase verify of this erase loop is not passed, then the erase loop count n of the first erasing voltage is increased by one.

For the third time, the erase loop is performed on the target erasing block with a first erasing voltage V3 of 15 V. The rest are done in the same manner until the first erasing voltage Vn reaches the predetermined value of 18 V. If erasing still fails, the second erasing voltages Um are used to perform the erase loops on the target erasing block, i.e., a second erasing voltage U2 of 19.5 V, instead of the first erasing voltage of 19 V, is used to perform the erase loop on the target erasing block. If this erase loop still fails, a second erasing voltage U3 of 21 V is used to perform the erase loop on the target erasing block. The rest are done in the same manner until the target erasing block is successfully erased. That is, starting from the erasing voltage of 18 V, the delta between erasing voltages used in two adjacent erase loops is increased from 1 V to 1.5 V. The erasing voltage is used to form a strong reverse electric field between the substrate and the floating gate of the memory cell (see FIG. 2) such that the electrons trapped in the floating gate 203 are attracted and move to wells 23 and 25 through the tunnel oxide layer 24 by means of tunneling, thereby reducing the charges trapped in the floating gate 203 and lowering the threshold voltage of the memory cell and thus changing the storage state of the memory cell and expanding the lifespan of the flash memory chip.

In one or more embodiments, 5 V≤the erasing voltage Vn (Um)≤30 V and 0.1 V≤d2≤1.6 V.

It is to be noted that deltas d1 and d2 and the predetermined value for the first erasing voltages may all be set by parameters. This embodiment just gives examples of the deltas d1 and d2 and does not limit the deltas d1 and d2. For details, see Table 2, a parameter table for the delta between erasing voltages used in two adjacent erase loops. It is feasible to set corresponding bits of the register to set the value of d1 or d2. The deltas d1 and d2 may be set using different delta parameter tables. Alternatively, the deltas d1 and d2 may be set using the same delta parameter table. Alternatively, the difference between d1 and d2 may be set using a difference parameter table.

TABLE 2

Parameter table for a delta between erasing voltages used in two adjacent erase loops

| [3] | [2] | [1] | [0] | Delta (V) |
|---|---|---|---|---|
| 0 | 0 | 0 | 0 | 0.1 |
| 0 | 0 | 0 | 1 | 0.2 |
| 0 | 0 | 1 | 0 | 0.3 |
| 0 | 0 | 1 | 1 | 0.4 |
| 0 | 1 | 0 | 0 | 0.5 |
| 0 | 1 | 0 | 1 | 0.6 |
| 0 | 1 | 1 | 0 | 0.7 |
| 0 | 1 | 1 | 1 | 0.8 |
| 1 | 0 | 0 | 0 | 0.9 |
| 1 | 0 | 0 | 1 | 1.0 |
| 1 | 0 | 1 | 0 | 1.1 |
| 1 | 0 | 1 | 1 | 1.2 |
| 1 | 1 | 0 | 0 | 1.3 |
| 1 | 1 | 0 | 1 | 1.4 |
| 1 | 1 | 1 | 0 | 1.5 |
| 1 | 1 | 1 | 1 | 1.6 |

Figure 6:
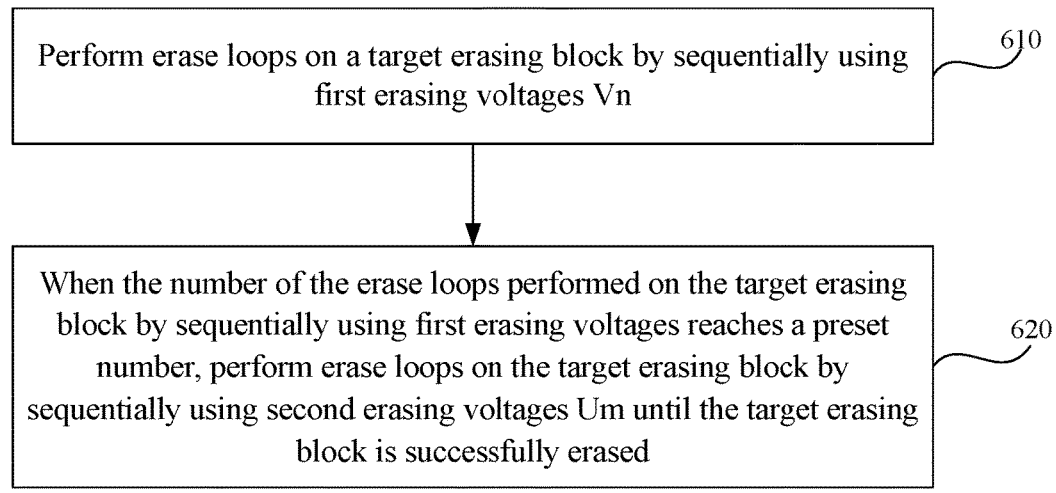
FIG. 6 is a flowchart of yet another erasing method for a non-volatile memory according to an embodiment of the present disclosure.

Referring to FIG. 6, which is a flowchart of yet another erasing method for a non-volatile memory. In one or more embodiments, the predetermined condition is that the number of the erase loops performed on the target erasing block by sequentially using the first erasing voltages Vn reaches a preset number.

The preset number for the first erasing voltages may be set by a parameter. For example, if the preset number is 4, four erase loops are performed on the target erasing block. If erasing still fails, starting from the fifth erase loop, the delta between erasing voltages used in two adjacent erase loops is different from that in the first to fourth erase loops. That is, the erasing voltage used in the fifth erase loop is equal to the erasing voltage used in the fourth erase loop plus the delta d2, and the erasing voltage used in the fourth erase loop is equal to the erasing voltage used in the third erase loop plus the delta d1. d1 may be greater than d2. In another embodiment, d1 is smaller than d2. Delta d1 and delta d2 may be set by a parameter table. The purpose of such configuration is to find a more appropriate erasing voltage so as to form a strong reverse electric field between the substrate and the floating gate of the memory cell (see FIG. 2) to such that the electrons trapped in the floating gate 203 are attracted to wells 23 and 25 through the tunnel oxide layer 24 by tunneling, thereby reducing the charges trapped in the floating gate 203 and lowering the threshold voltage of the memory cell that is difficult to be erased and thus changing the storage state of the memory cell and expanding the lifespan of the flash memory chip.

For details, see Table 3, a parameter table for an erase loop count. The preset number for the first erasing voltages may be set by the parameter table for the erase loop count.

TABLE 3

Parameter table for an erase loop count

| [2] | [1] | [0] | Erase cycle count |
|---|---|---|---|
| 0 | 0 | 0 | 1 |
| 0 | 0 | 1 | 2 |
| 0 | 1 | 0 | 3 |
| 0 | 1 | 1 | 4 |
| 1 | 0 | 0 | 5 |
| 1 | 0 | 1 | 6 |
| 1 | 1 | 0 | 7 |
| 1 | 1 | 1 | 8 |

In one or more embodiments, the predetermined condition is that the number of memory cells that have not passed the erase verify among the plurality of memory cells in the target erasing block is greater than a preset number. This indicates that too many memory cells in the target erasing block have failed to be erased and these memory cells are difficult to be erased. Thus, the delta between erasing voltages used in two adjacent erase loops needs to be changed so that the erase loop is performed using a more appropriate erasing voltage on the memory cells that have failed to be erased. In this way, memory cells that are difficult to be erased can be erased successfully and thereby the lifespan of the flash memory chip is extended.

Figure 7:
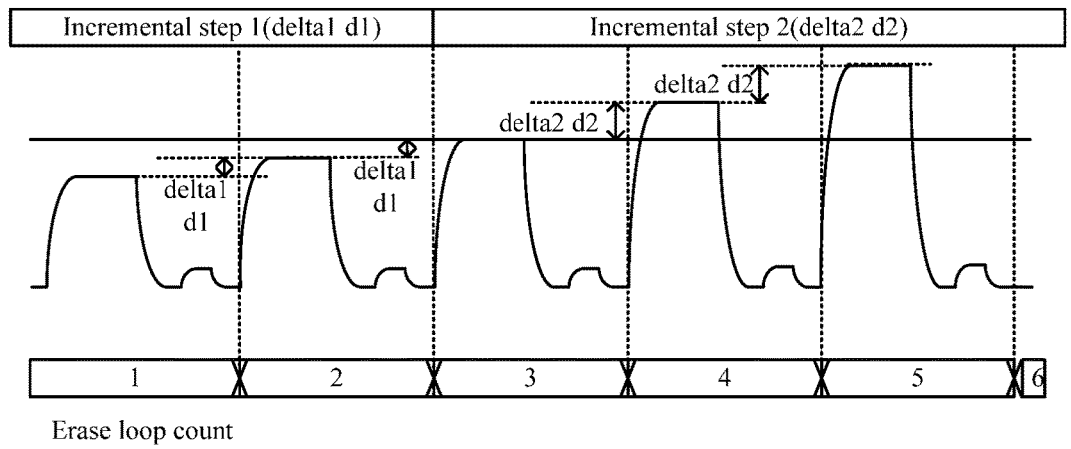
FIG. 7 is a schematic diagram illustrating an erasing voltage difference between two adjacent erase loops according to an embodiment of the present disclosure.
Figure 8:
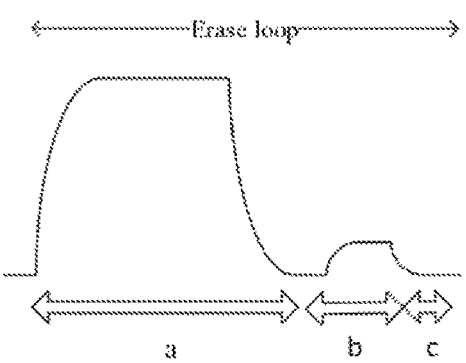
FIG. 8 is a diagram of an erasing voltage in an erase loop according to an embodiment of the present disclosure.

In one or more embodiments, the delta between erasing voltages used in two adjacent erase loops is shown in FIG. 7. The predetermined condition for changing the delta is that the number of the erase loops performed on the target erasing block by sequentially using the first erasing voltages Vn reaches a preset number; or the first erasing voltage Vn reaches a predetermined value. FIG. 8 shows the erasing voltage in a single erase loop. As shown in FIG. 8, phase "a" indicates the erase phase, phase "b" indicates the erase verify phase and phase "c" indicates the scan phase. The erasing method provided by this embodiment changes the delta between erasing voltages used in two adjacent erase loops to find a more appropriate erasing voltage and thus successfully erases a memory cell that is difficult to be erased, thereby extending a lifespan of a flash memory chip.

Figure 9:
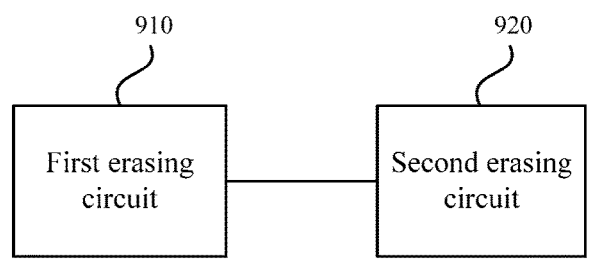
FIG. 9 is a structure diagram of an erasing apparatus for memory cells according to an embodiment of the present disclosure.

FIG. 9 is a structure diagram of an erasing apparatus for a non-volatile memory according to embodiment 2 of the present disclosure. The apparatus includes a first erasing circuit 910 and a second erasing circuit 920.

The first erasing circuit 910 is configured to perform erase loops on a target erasing block by sequentially using first erasing voltages Vn. The second erasing circuit 920 is configured to, when a predetermined condition is reached, perform erase loops on the target erasing block by sequentially using second erasing voltages Um until the target erasing block is successfully erased. $Vn=V1+(n-1)\times d1$, where n denotes an erase loop count of the first erasing voltage, n is an integer greater than or equal to 1, and V1 and d1 are all positive numbers. $Um=Vn+(m-1)\times d2$, where m denotes an erase loop count of the second erasing voltage, m is an integer greater than or equal to 2, and d2 is a positive number not equal to d1.

In one or more embodiments, the first erasing circuit 910 includes: a first erasing sub-circuit, a verification circuit, a returning circuit and an ending circuit. The first erasing sub-circuit is configured to perform an erase operation on the target erasing block using the first erasing voltage Vn. The verification circuit is configured to perform an erase verify for this erase operation. If the erase verify is not passed, The verification circuit is configured to increase the erase loop count n of the first erasing voltage by one. The returning circuit is configured to return to the step of performing the erase operation on the target erasing block using the first erasing voltage Vn. The ending circuit is configured to, if the erase verify is passed, end a process.

In one or more embodiments, the predetermined condition includes that the number of the erase loops performed on the target erasing block by sequentially using the first erasing voltages Vn reaches a preset number; or the first erasing voltage Vn reaches a predetermined value.

In one or more embodiments, the predetermined condition includes that the number of memory cells that have not passed the erase verify among the plurality of memory cells in the target erasing block is greater than a preset number.

The erasing apparatus for a non-volatile memory provided by this embodiment changes a delta between erasing voltages used in two adjacent erase loops to find a more appropriate erasing voltage and thus successfully erases a memory cell that is difficult to be erased, thereby extending a lifespan of a flash memory chip.

The above apparatus can execute the method provided by any embodiment of the present disclosure, and has functional modules and beneficial effects corresponding to the execution of the method.

In one or more embodiments, embodiments of the present disclosure further provide a storage medium containing the erasing apparatus described in the above embodiment.

In one or more embodiments, embodiments of the present disclosure further provide a storage medium containing computer-executable instructions that, when executed by a computer processor, implement an erasing method for a non-volatile memory. The method includes performing erase loops on a target erasing block by sequentially using first erasing voltages Vn; and when a predetermined condition is reached, performing erase loops on the target erasing block by sequentially using second erasing voltages Um until the target erasing block is successfully erased.

$Vn=V1+(n-1)\times d1$, where n denotes an erase loop count of the first erasing voltage, n is an integer greater than or equal to 1, and V1 and d1 are all positive numbers. $Um=Vn+(m-1)\times d2$, where m denotes an erase loop count of the second erasing voltage, m is an integer greater than or equal to 1, and d2 is a positive number not equal to d1.

In the storage medium containing computer-executable instructions provided by embodiments of the present disclosure, the computer-executable instructions implement not only the above method operations but also related operations in the erasing method for a memory cell provided by any embodiment of the present disclosure.

An embodiment of the present disclosure provides an erasing method for a non-volatile memory. The non-volatile memory includes a plurality of erasing blocks. Each erasing block includes a plurality of memory cells.

Figure 10:
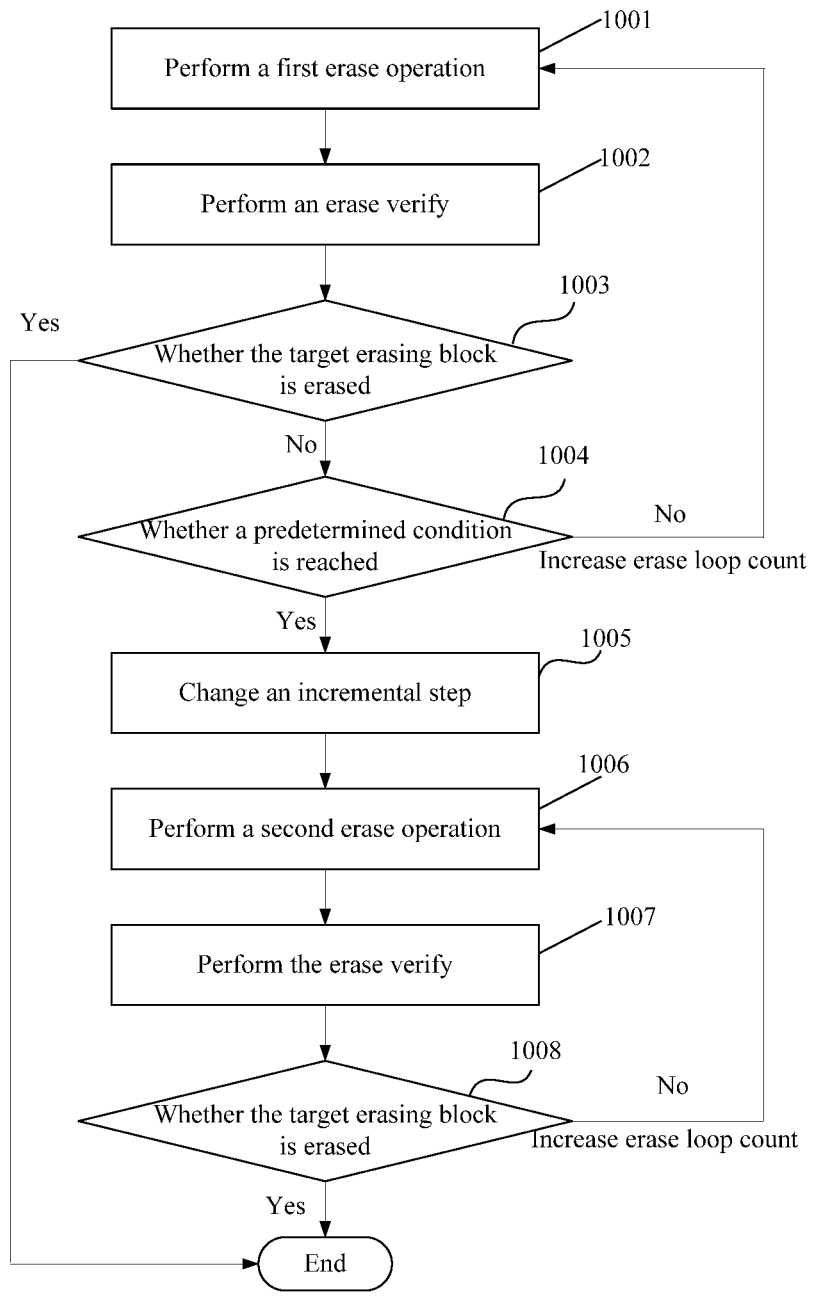
FIG. 10 is a flowchart of an erasing method for a non-volatile memory according to an embodiment of the present disclosure.
Figure 11:
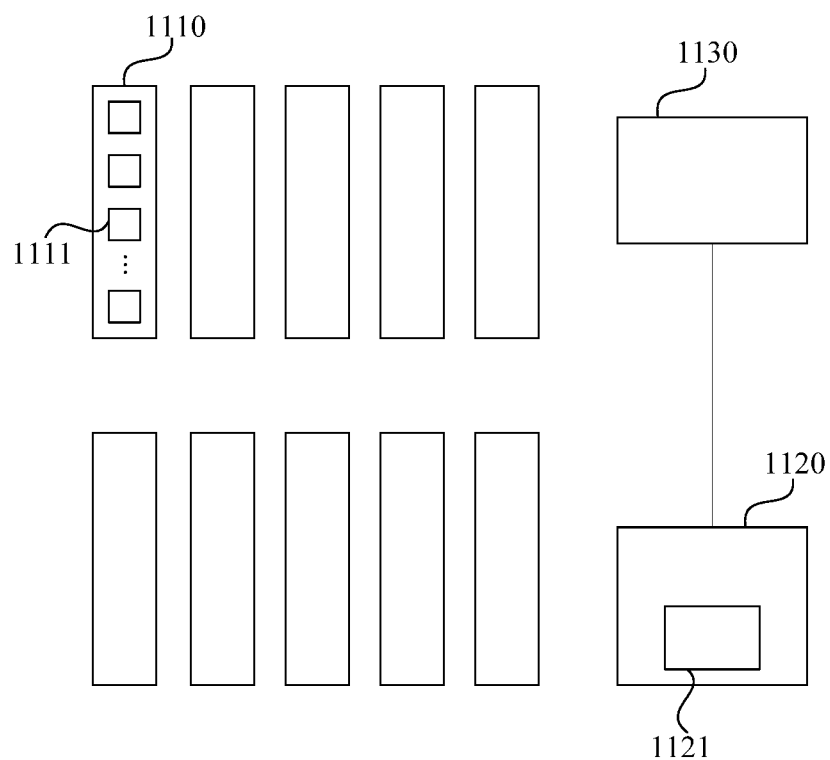
FIG. 11 is a structure diagram of a non-volatile memory according to an embodiment of the present disclosure.

The erasing method is illustrated in FIG. 10. In step S1001, a first erase operation is performed on a target erasing block with a first erasing voltage. The first erasing voltage is a voltage pulse.

In step S1002, an erase verify is performed for the first erase operation in step S1001.

In step S1003, it is determined whether the target erasing block is successfully erased according to the result of the erase verify in step S1002. If it is determined that the target erasing block is successfully erased, the erasing method is ended. If it is determined that the target erasing block is not successfully erased, the erasing method goes to step S1004.

In step S1004, it is determined that whether a predetermined condition is reached. If the predetermined condition is reached, the erasing method goes to step S1005. If the predetermined condition is not reached, the erase loop count is increased by one, and the erasing method returns to step S1001. That is, the magnitude of the first pulse is increased by a first step.

In an alternative embodiment, the predetermined condition is that the number of the first erase operations which have been performed on the target erasing block reaches a preset number. That is, the erase loop count for the first erase operations reaches a preset number.

In an alternative embodiment, the predetermined condition is that the first erasing voltage is increased to a predetermined value.

In an alternative embodiment, the predetermined condition is that the number of memory cells, whose the erase verifies are failed, among the plurality of memory cells in the target block is greater than or equal to a preset number.

In step S1005, the incremental step is changed from the first step to a second step, and the erase loop count is increased by one to obtain an initial second erasing voltage.

In step S1006, a second erase operation is performed on the target erasing block with the second erasing voltage.

In step S1007, an erase verify is performed for the second erase operation in step S1006.

In step S1008, it is determined whether the target erasing block is successfully erased according to the result of the erase verify in step S1007. If it is determined that the target erasing block is successfully erased, the erasing method is ended. If it is determined that the target erasing block is not successfully erased, the erase loop count is increased by one, and the erasing method returns to step S1006. That is, the second erasing voltage is increased by the second step.

An embodiment of the present disclosure provides a non-volatile memory. The non-volatile memory includes a plurality of blocks 1110 and a controller 1120. Each of the plurality of blocks 1110 includes a plurality of memory cells 1111.

The controller is configured to: perform erase loops on a target block of the plurality of blocks by sequentially using first erasing voltages Vn, and when a predetermined condition is reached, perform erase loops on the target block by sequentially using second erasing voltages Um. The first erasing voltages Vn are first incremental-step-pulses. The second erasing voltages Um are second incremental-step-pulses. In one embodiment, the first incremental-step-pulses have a first step (first delta), and the second incremental-step-pulses have a second step (second delta).

Each erase loop includes an erase phase and an erase verify phase. In the erase phase of each erase loop, the first erasing voltage (or, the second erasing voltage) for this erase loop is applied to the substrate of the target block. In the erase verify phase of each erase loop, an erase verify (a read operation) is performed on the plurality of memory cells of the target erasing block. If the result of the read operation indicates that the plurality of memory cells store information 1, it means that the target erasing block is successfully erased. In another embodiment, in addition to the erase phase and the erase verify phase, each erase loop includes a scan phase. In the scan phase of each erase loop, the result of the erase verify is stored.

In an embodiment, the non-volatile memory is a NAND flash memory.

In an alternative embodiment, the predetermined condition is that the number of the erase loops performed on the target block by sequentially using first erasing voltages reaches a preset number.

In an alternative embodiment, the predetermined condition is that the first erasing voltage is increased to a predetermined value.

In an alternative embodiment, the predetermined condition is that the number of memory cells, the erase verifies of which are failed, among the plurality of memory cells in the target block is greater than or equal to a preset number.

In an alternative embodiment, the non-volatile memory further includes a charge pump 1130. The controller 1120 is configured to cause the charge pump 1130 to generate the first incremental-step-pulses and the second incremental-step-pulses.

The controller 1120 includes a sense amplifier 1121. The sense amplifier 1121 is configured to compare a current on a bit line connected to the target block with a reference current to generate a comparison result, and the controller 1120 determines whether the target erasing block is erased based on the comparison result.

Embodiments in this specification are described in a progressive manner. Each embodiment focuses on differences from other embodiments. The same or similar parts in the embodiments can be referred to by each other.

It is to be noted that the above are only embodiments of the present disclosure and the technical principles used therein. It is to be understood by those skilled in the art that the present disclosure is not limited to the embodiments described herein.

What is claimed is:

1. An erasing method for memory cells, comprising:
    performing erase loops on a target erasing block by sequentially using first erasing voltages Vn; and
    when a predetermined condition is reached, proceeding to perform erase loops on the target erasing block by sequentially using second erasing voltages Um until the target erasing block is successfully erased,
    wherein Vn=V1+(n−1)×d1, wherein n denotes erase loop count of the first erasing voltages, n is an integer greater than or equal to 1, and V1 and d1 are all positive numbers; and Um=Vn+(m−1)×d2, wherein m denotes erase loop count of the second erasing voltages, m is an integer greater than or equal to 2, and d2 is a positive number not equal to d1.

2. The erasing method of claim 1, wherein the performing erase loops on a target erasing block by sequentially using first erasing voltages comprises:
    performing an erase operation on the target erasing block using a respective one of the first erasing voltages;
    performing an erase verify for the erase operation;
    if the erase verify is not passed, increasing the erase loop count n for the first erasing voltages by one and returning to the step of performing an erase operation on the target erasing block using a respective one of the first erasing voltages; and
    if the erase verify is passed, ending the erasing method.

3. The erasing method of claim 1, wherein the predetermined condition comprises: a number of the erase loops performed on the target erasing block by sequentially using first erasing voltages reaches a preset number.

4. The erasing method of claim 2, wherein the predetermined condition comprises: a number of the erase loops performed on the target erasing block by sequentially using first erasing voltages reaches a preset number.

5. The erasing method of claim 1, wherein the predetermined condition comprises: one of the first erasing voltages reaches a predetermined value.

6. The erasing method of claim 2, wherein the predetermined condition comprises: one of the first erasing voltages reaches a predetermined value.

7. The erasing method of claim 2, wherein the predetermined condition comprises: a number of memory cells, that have not passed the erase verify, in the target erasing block is greater than a preset number.

8. The erasing method of claim 1, wherein the proceeding to perform erase loops on the target erasing block by sequentially using second erasing voltages comprises:
    performing an erase operation on the target erasing block using a respective one of the second erasing voltages;
    performing an erase verify for the erase operation;
    if the erase verify is not passed, increasing the erase loop count m for the second erasing voltages by one and returning to the step of performing an erase operation on the target erasing block using a respective one of the second erasing voltages; and
    if the erase verify is passed, ending erasing method,
    wherein an initial value of the erase loop count m of the second erasing voltages is 2.

9. The erasing method of claim 1, wherein performing an erase operation on the target erasing block comprises: applying, by a charge pump, the first erasing voltages Vn or the second erasing voltages Um to a substrate of memory cells in the target erasing block.

10. The erasing method of claim 2, wherein performing an erase operation on the target erasing block comprises: applying, by a charge pump, the first erasing voltages Vn or the second erasing voltages Um to a substrate of memory cells in the target erasing block.

11. The erasing method of claim 2, wherein the performing the erase verify for the erase operation comprises:
    performing a read operation on memory cells in the target erasing block; and
    if a reading result is 1, determining that the erase operation succeeds, and if the reading result is 0, determining that the erase operation fails.

* * * * *